United States Patent
Zhu et al.

(10) Patent No.: US 10,366,917 B2
(45) Date of Patent: Jul. 30, 2019

(54) METHODS OF PATTERNING VARIABLE WIDTH METALLIZATION LINES

(71) Applicant: GLOBALFOUNDRIES Inc., Grand Cayman (KY)

(72) Inventors: Xuelian Zhu, San Jose, CA (US); Jia Zeng, Sunnyvale, CA (US); Chenchen Wang, Santa Clara, CA (US); Jongwook Kye, Pleasanton, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/861,799

(22) Filed: Jan. 4, 2018

(65) Prior Publication Data

US 2019/0206717 A1     Jul. 4, 2019

(51) Int. Cl.
*H01L 21/48* (2006.01)
*H01L 21/768* (2006.01)

(52) U.S. Cl.
CPC ........ *H01L 21/768* (2013.01); *H01L 21/4857* (2013.01)

(58) Field of Classification Search
None
See application file for complete search history.

(56) References Cited

U.S. PATENT DOCUMENTS

| 9,818,641 | B1 * | 11/2017 | Bouche | H01L 21/31144 |
| 9,887,135 | B1 * | 2/2018 | Wallner | H01L 21/0337 |
| 2016/0049307 | A1 * | 2/2016 | Chen | H01L 21/0337 438/696 |

* cited by examiner

*Primary Examiner* — Telly D Green
(74) *Attorney, Agent, or Firm* — Thompson Hine LLP; Anthony Canale

(57) ABSTRACT

Methods of patterning metallization lines having variable widths in a metallization layer. A first mandrel layer is formed over a mask layer, with the mask layer overlying a second mandrel layer. The first mandrel layer is etched to form mandrel lines that have variable widths. The first non-mandrel trenches are etched in the mask layer, where the non-mandrel trenches have variable widths. The first mandrel lines are used to etch mandrel trenches in the mask layer, so that the mandrel lines and first non-mandrel lines define a mandrel pattern. The second mandrel layer is etched according to the mandrel pattern to form second mandrel lines, with the second mandrel lines having the variable widths of the plurality of first mandrel lines and the variable widths of the plurality of non-mandrel trenches.

20 Claims, 24 Drawing Sheets

METHODS OF PATTERNING VARIABLE WIDTH METALLIZATION LINES

BACKGROUND

The present invention relates to semiconductor device fabrication and integrated circuits and, more specifically, to methods of patterning metallization lines in metallization layers of integrated circuits.

Metallization layers in integrated circuits allow for electrical connection between layers of integrated circuits and external devices. As circuit sizes have continued to shrink, new methods for patterning and forming metallization lines, such as self-aligned multiple patterning techniques, continue to be developed to overcome limitations of existing fabrication equipment in meeting design requirements for newer and even smaller metallization patterns.

SUMMARY

In an embodiment of the invention, a method includes forming a first mandrel layer over a mask layer, with the mask layer overlying a second mandrel layer. The first mandrel layer is etched to form first mandrel lines that have variable widths. The first non-mandrel trenches are etched in the mask layer, where the non-mandrel trenches have variable widths. The first mandrel lines are used to etch mandrel trenches in the mask layer, so that the first mandrel lines and non-mandrel lines define a mandrel pattern. The second mandrel layer is etched according to the mandrel pattern to form second mandrel lines, with the second mandrel lines having the variable widths of the plurality of first mandrel lines and the variable widths of the plurality of non-mandrel trenches.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2A is a top view of the structure in which FIG. 2 is taken generally along line 2-2.

FIG. 7A is a top view of the structure in which FIG. 7 is taken generally along line 7-7.

FIG. 10A is a top view of the structure in which FIG. 10 is taken generally along line 10-10.

FIG. 13A is a top view of the structure in which FIG. 13 is taken generally along line 13-13.

FIG. 14A is a top view of the structure in which FIG. 14 is taken generally along line 14-14.

FIG. 15A is a top view of the structure in which FIG. 15 is taken generally along line 15-15.

FIG. 18A is a top view of the structure in which FIG. 18 is taken generally along line 18-18.

FIG. 21A is a top view of the structure in which FIG. 21 is taken generally along line 21-21.

FIG. 28A is a top view of the structure in which FIG. 28 is taken generally along line 28-28.

FIG. 29A is a top view of the structure in which FIG. 29 is taken generally along line 29-29.

FIG. 30A is a top view of the structure in which FIG. 30 is taken generally along line 30-30.

FIG. 31A is a top view of the structure in which FIG. 31 is taken generally along line 31-31.

FIG. 32A is a top view of the structure in which FIG. 32 is taken generally along line 32-32.

DETAILED DESCRIPTION

Figure 1:
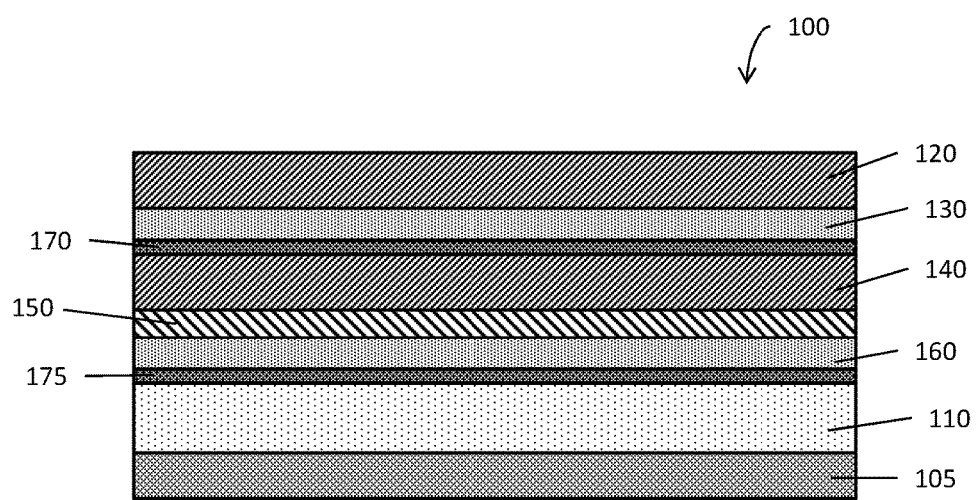
FIGS. 1-34 are cross-sectional views of a structure at successive fabrication stages of a processing method in accordance with embodiments of the invention.

With reference to FIG. 1 and in accordance with embodiments of the invention, a structure 100 includes one or more lower circuit structure layers 105, a dielectric layer 110, a first mandrel layer 120, an upper mask layer 130, a second mandrel layer 140, an intermediary mask layer 150, and a lower mask layer 160. Structure 100 may also include a sacrificial etch-stop layer 170 over second mandrel layer 140 and another sacrificial etch-stop layer 175 over dielectric layer 110. Lower circuit structure layers 105 may include a semiconductor substrate that includes active and/or passive circuit structure features, such as transistors and diodes, as well as additional circuit structure layers formed and patterned over the substrate. Dielectric layer 110 may be any dielectric material in which metallization lines are to be patterned and formed, as further described below, with the dielectric material providing electric isolation between metallization lines. First mandrel layer 120 and second mandrel layer 140 may be composed of any material, for instance amorphous silicon (a-Si), used to form mandrel lines in multiple patterning processes, such as self-aligned double-patterning (SADP) or self-aligned quadruple-patterning (SAQP) processes. First mandrel layer 120 and second mandrel layer 140 may be composed of the same material or of different materials. Upper mask layer 130 and lower mask layer 160 may be composed of any hardmask material such as titanium nitride, or other mask material. Intermediary mask layer 150 may be composed of any hardmask material or other type of mask material different from the material of lower mask layer 160, so that lower mask layer 160 may be selectively etched with respect to intermediary mask layer 150. For example, intermediary mask layer 150 may be composed of silicon nitride in embodiments where lower mask layer 160 is composed of titanium nitride. Sacrificial etch-stop layers 170 and 175 may be any dielectric material, such as silicon nitride, and may be provided as etch stop layers for fabrication steps, described in further detail below, in which portions of upper mask layer 130 or lower mask layer 160 are etched.

Figure 2:
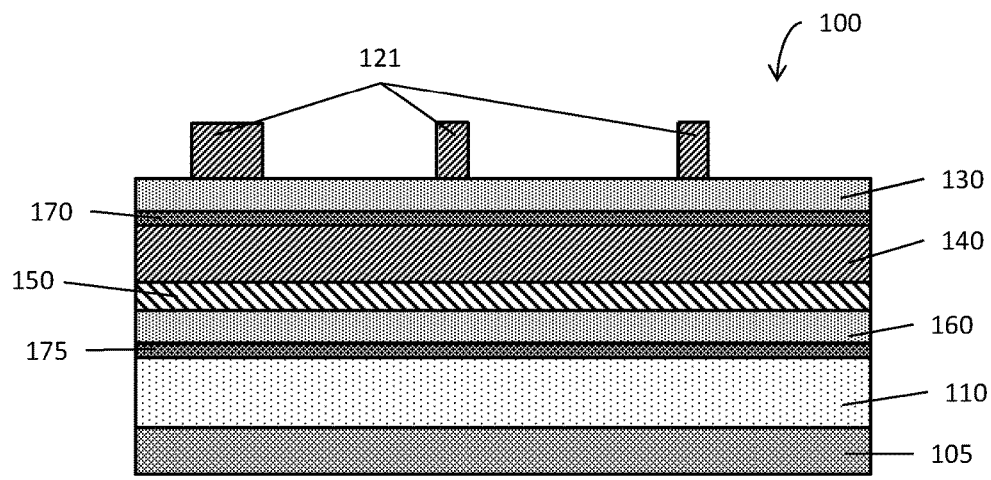
Figure 2A:
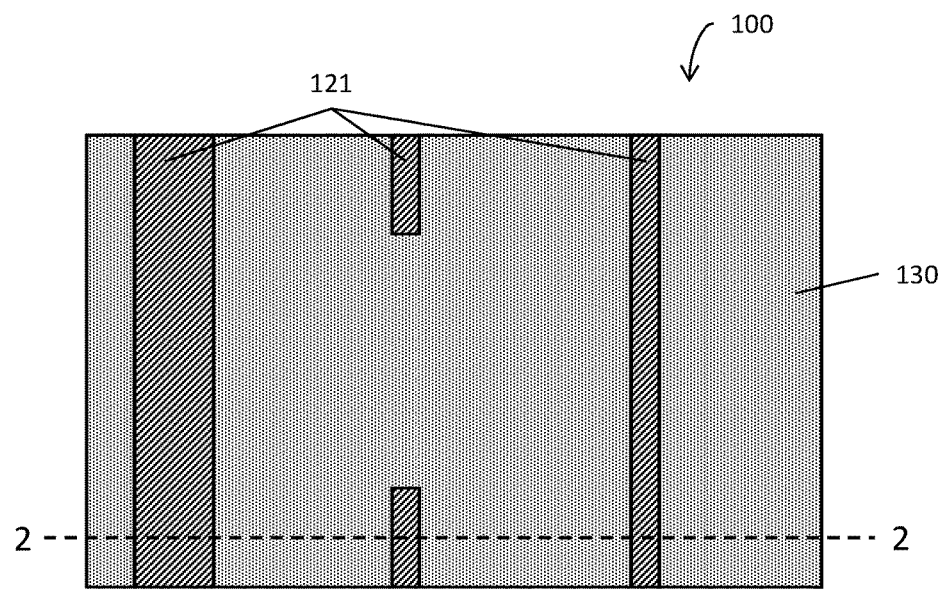

With reference to FIGS. 2 and 2A in which like reference numerals refer to like features in FIG. 1 and at a subsequent fabrication stage of the processing method, first mandrel lines 121 are formed from the material of first mandrel layer 120. First mandrel lines 121 may be formed, for example, by a photolithographic etch process. A photolithographic etch process may include, for example, providing a lithography stack over structure 100 and a patterned resist layer over the lithography stack, where the patterned resist layer includes openings corresponding to portions of first mandrel layer 120 to be removed. The lithography stack is etched and removed according to the patterned resist layer to expose portions of first mandrel layer 120 to be removed. The exposed portions of first mandrel layer 120 are etched and removed, leaving first mandrel lines 121 over upper mask layer 130, and the remaining portions of the lithography stack and resist layer are removed from over first mandrel lines 121. As depicted in FIG. 2 and FIG. 2A, first mandrel lines 121 may be patterned to have variable widths. First mandrel layer 120 may be etched, for example, by a reactive-ion etch (RIE) process or other anisotropic etch process that removes the material of the first mandrel layer 120 selective to the material of the upper mask layer 130.

Figure 3:
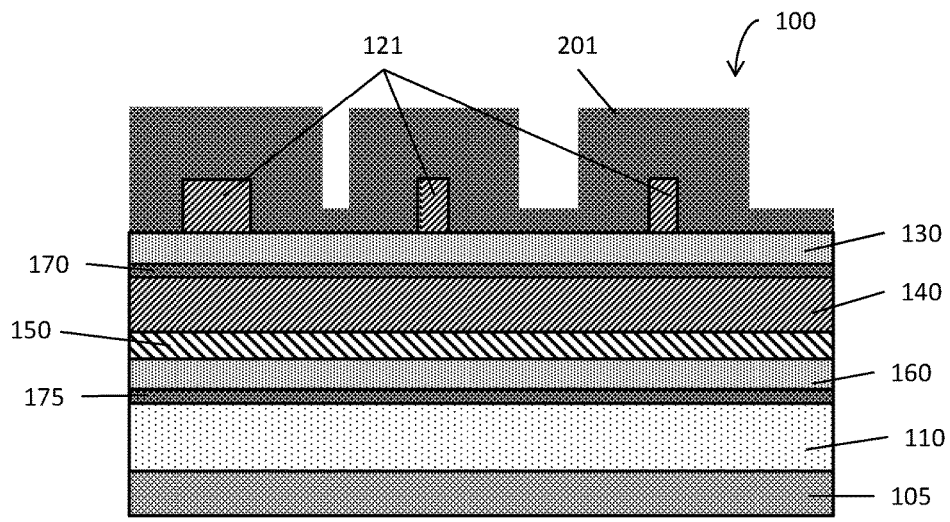

With reference to FIG. 3 in which like reference numerals refer to like features in FIGS. 2 and 2A and at a subsequent fabrication stage of the processing method, a spacer material 201 is deposited over first mandrel lines 121 and upper mask layer 130. Spacer material 201 may be a conformal layer deposited by any deposition technique, such as chemical vapor deposition (CVD) or atomic layer deposition (ALD), and may be composed of an oxide of silicon, an oxide of titanium, or other dielectric material.

Figure 4:
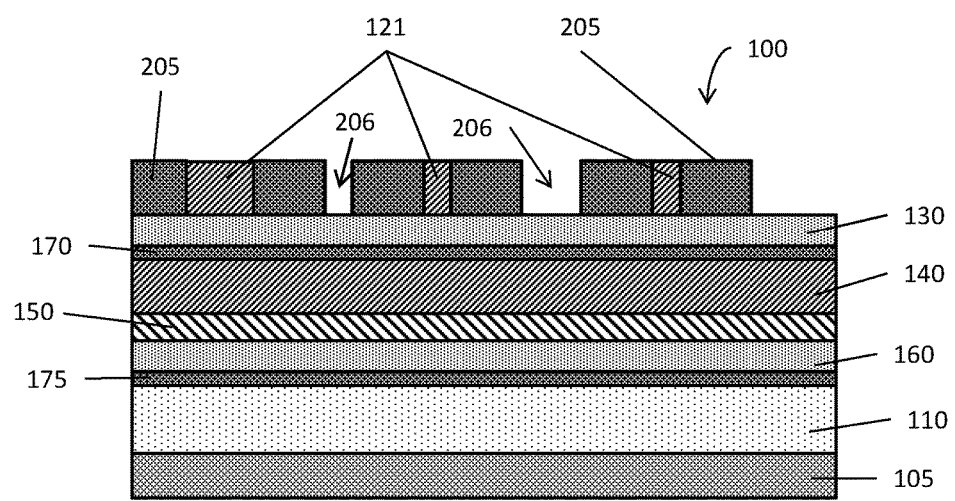

With reference to FIG. 4 in which like reference numerals refer to like features in FIG. 3 and at a subsequent fabrication stage of the processing method, spacer material 201 is etched with, for example, a reactive ion etch to form first mandrel spacers 205 on sidewalls of first mandrel lines 121. The resulting first mandrel spacers 205 may have a uniform width, as shown in FIG. 4, and may define spaces 206 in between the first mandrel spacers 205 that have variable widths and that expose portions of upper mask layer 130 corresponding, at least partially, to first non-mandrel trenches to be formed in upper mask layer 130, as further described below.

Figure 5:
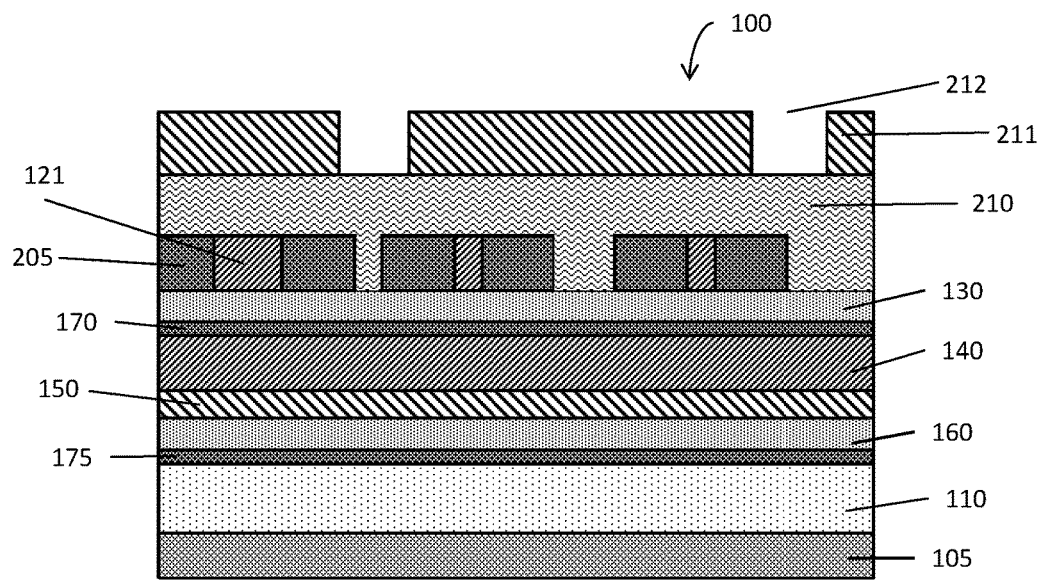

With reference to FIG. 5 in which like reference numerals refer to like features in FIG. 2 and at a subsequent fabrication stage of the processing method, a lithography stack 210 and patterned resist 211 are formed over structure 100. Lithography stack 210 may include one or more photolithography layers, such as an anti-reflective layer and a planarization layer. Patterned resist 211 is patterned with openings 212 exposing portions of lithography stack 210 and generally aligned with spaces 206 between first mandrel spacers 205, corresponding to non-mandrel lines to be formed in upper mask layer 130, as further described below. Some portions of patterned resist 211, as illustrated in FIG. 5, may block some spaces or portions of spaces 206 between first mandrel spacers 205, corresponding to portions of the upper mask layer 130 that will remain unetched in forming first non-mandrel trenches.

Figure 6:
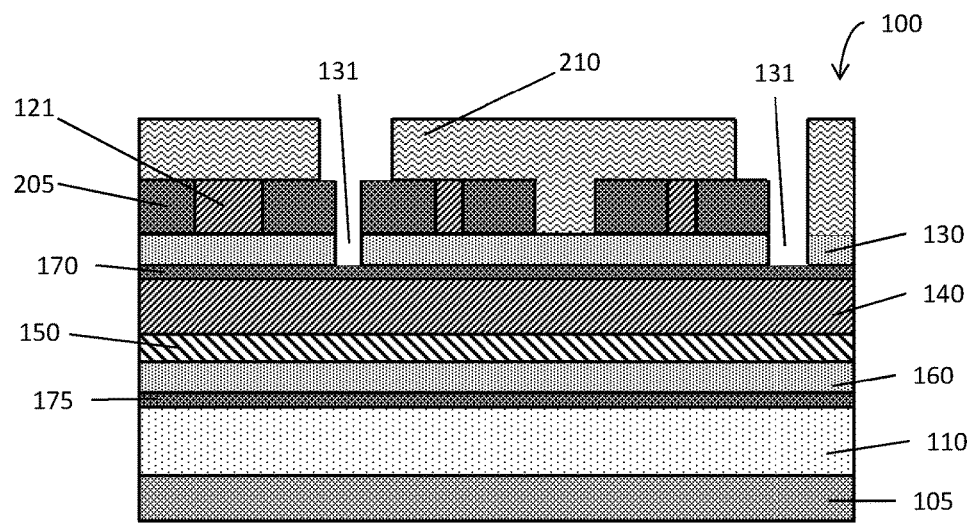

With reference to FIG. 6 in which like reference numerals refer to like features in FIG. 5 and at a subsequent fabrication stage of the processing method, the exposed portions of lithography stack 210 are etched to expose portions of upper mask layer 130, and the exposed portions of upper mask layer 130 etched to form first non-mandrel trenches 131. Portions of lithography stack 210 covered by the patterned resist 211 are protected from the etching of exposed portions of lithography stack 210, and corresponding underlying portions of upper mask layer 130 are protected by the remaining portions of lithography stack and the first mandrel spacers 205 as exposed portions of upper mask layer 130 are etched to form first non-mandrel trenches 131. The etching of lithography stack 210 and/or upper mask layer 130 may include one or more selective RIE processes, for example. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

Figure 7:
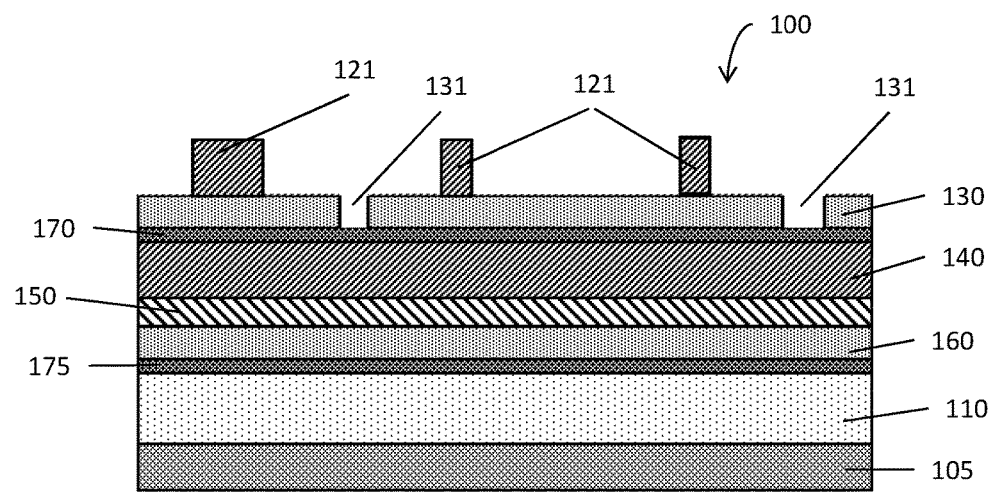
Figure 7A:
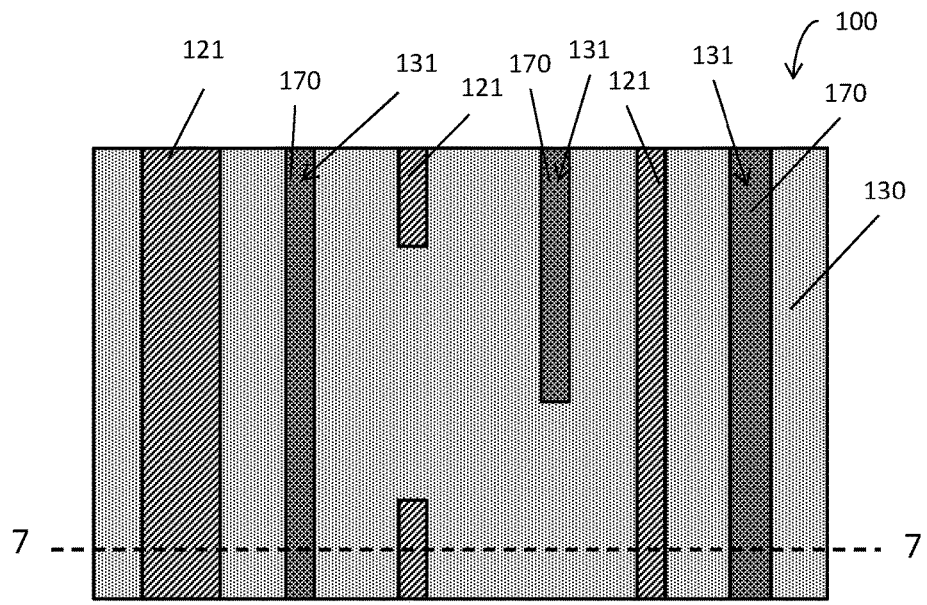

With reference to FIGS. 7 and 7A in which like reference numerals refer to like features in FIG. 6 and at a subsequent fabrication stage of the processing method, remaining portions of lithography stack 210 are removed and first mandrel spacers 205 are removed. Lithography stack 210 and first mandrel spacers 205 may be removed, for example, by a single etch process or may be removed in multiple, separate etch processes.

Figure 8:
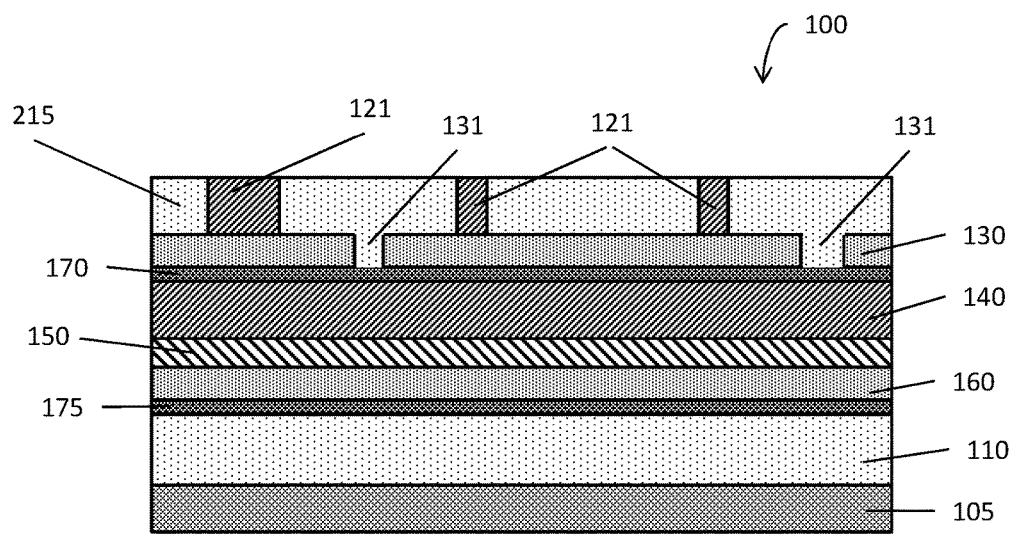

With reference to FIG. 8 in which like reference numerals refer to like features in FIGS. 7 and 7A and at a subsequent fabrication stage of the processing method, a sacrificial hardmask 215 is formed over structure 100. The sacrificial hardmask may be, for example, a spin-on hardmask (SOH) that is subsequently planarized with top surfaces of first mandrel lines 121, such as by a chemical-mechanical polishing (CMP) process, so that sacrificial hardmask 215 is disposed over first non-mandrel trenches 131 and between first mandrel lines 121.

Figure 9:
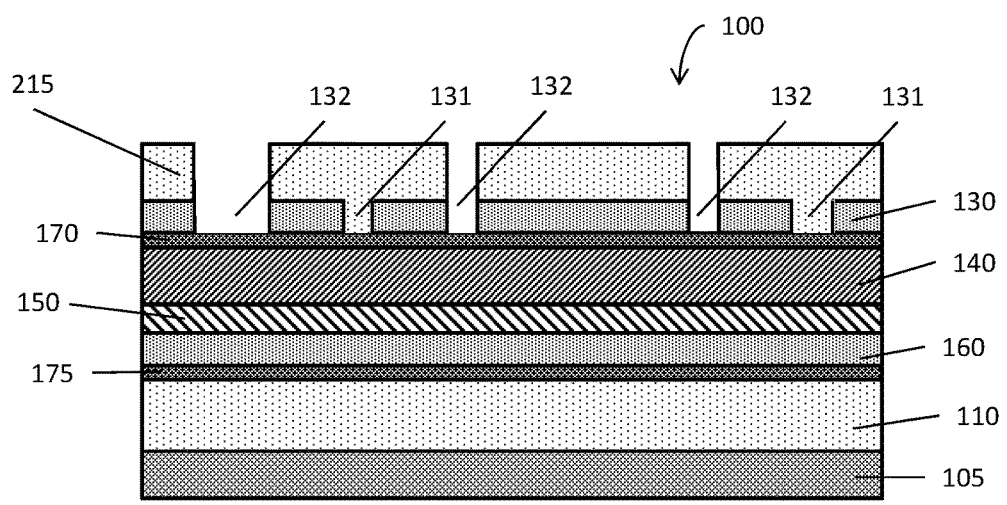

With reference to FIG. 9 in which like reference numerals refer to like features in FIG. 8 and at a subsequent fabrication stage of the processing method, first mandrel lines 121 are removed to expose underlying portions of upper mask layer 130, and the exposed portions of upper mask layer 130 are etched to form first mandrel trenches 132 in upper mask layer 130. Etching of upper mask layer 130 may include, for example, a selective RIE process or other anisotropic etch process.

Figure 10:
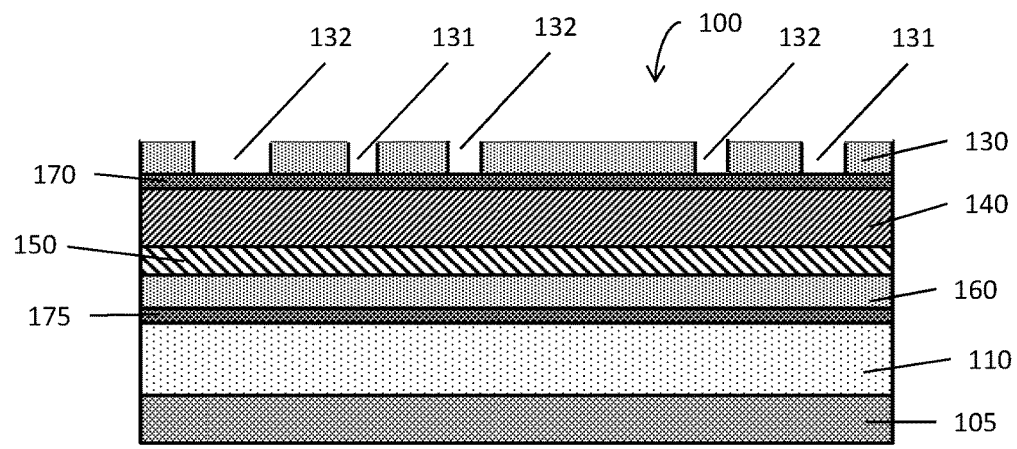
Figure 10A:
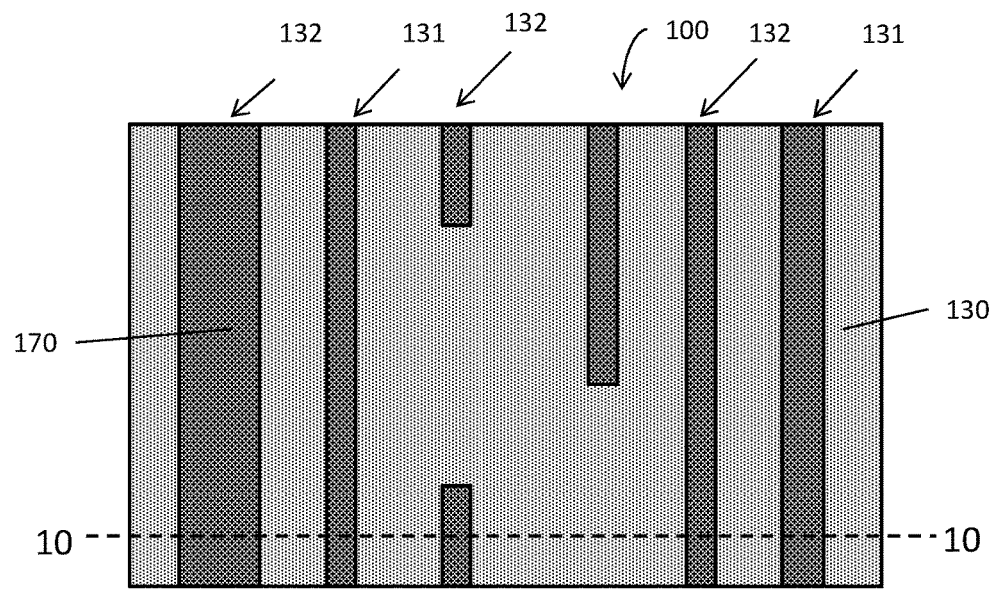

With reference to FIGS. 10 and 10A in which like reference numerals refer to like features in FIG. 9 and at a subsequent fabrication stage of the processing method, remaining portions of sacrificial hardmask 215 are removed. The first mandrel trenches 132 and first non-mandrel trenches 131 together define a second mandrel pattern in the upper mask layer 130 to be used, as described further below, to form second non-mandrel lines 141 in second mandrel layer 140. As FIGS. 10 and 10A illustrate, first mandrel trenches 132 may have variable widths and first non-mandrel trenches 131 may have variable widths, so that the second mandrel lines 141 formed from second mandrel layer 140 may all have variable widths as well, according to the particular design requirements of a metallization layer.

Figure 11:
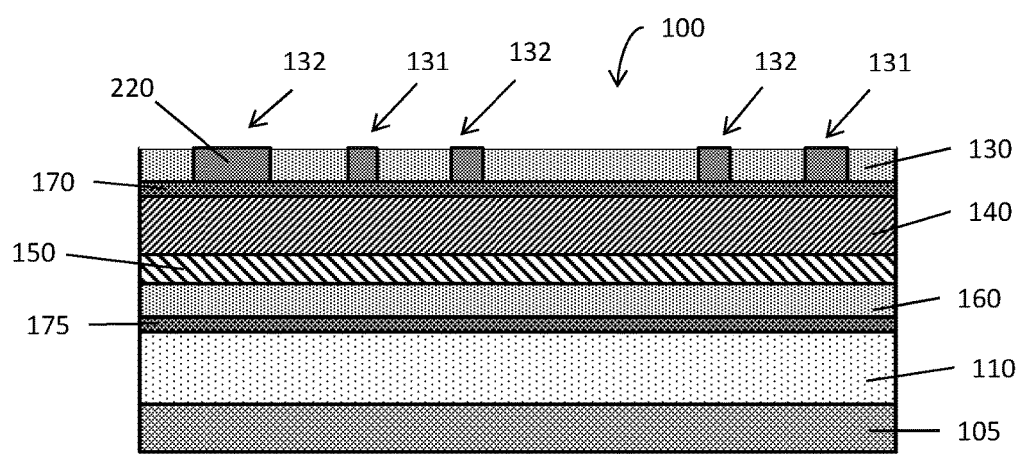

With reference to FIG. 11 in which like reference numerals refer to like features in FIGS. 10 and 10A and at a subsequent fabrication stage of the processing method, first mandrel trenches 132 and first non-mandrel trenches 131 are filled with a sacrificial fill material 220, such as a glass or spin-on glass material. Sacrificial fill material 220 may be deposited over structure 100 and subsequently planarized with top surfaces of upper mask layer 130, as illustrated in FIG. 11.

Figure 12:
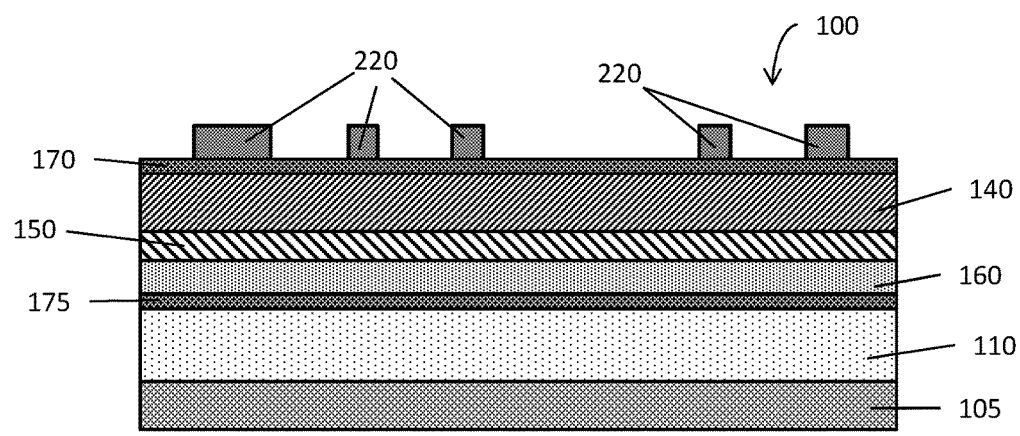

With reference to FIG. 12 in which like reference numerals refer to like features in FIG. 11 and at a subsequent fabrication stage of the processing method, remaining portions of upper mask layer 130 are removed to expose portions of second mandrel layer 140 or portions of sacrificial etch-stop layer 170, if sacrificial etch-stop layer 170 is included.

Figure 13:
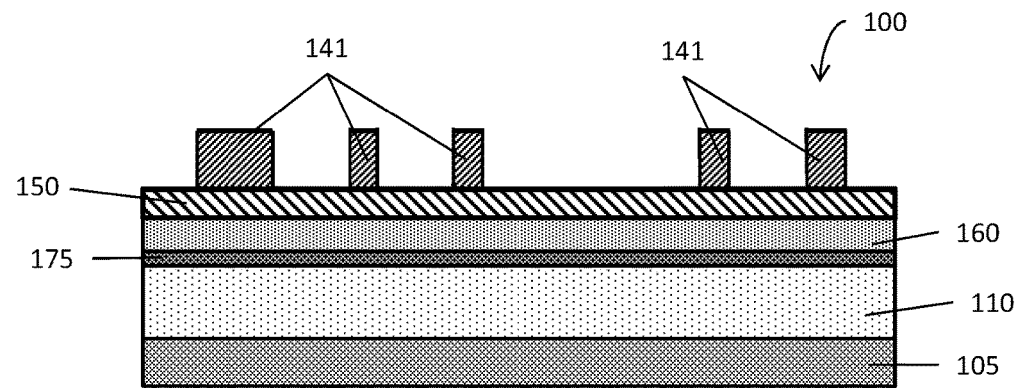
Figure 13A:
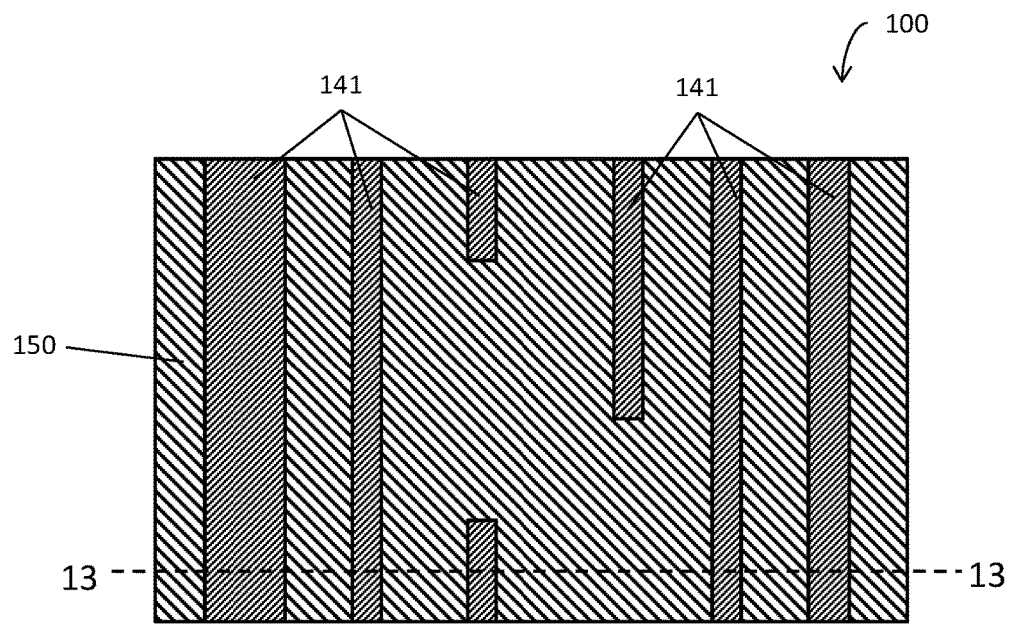

With reference to FIGS. 13 and 13A in which like reference numerals refer to like features in FIG. 12 and at a subsequent fabrication stage of the processing method, exposed portions of second mandrel layer 140 are etched and removed. Sacrificial fill material 220 protects the underlying portions of second mandrel layer 140 from the etch process so that the remaining portions of second mandrel layer 140 form second mandrel lines 141. If sacrificial etch-stop layer 170 is included, the exposed portions of sacrificial etch-stop layer 170 may be etched and removed prior to etching exposed portions of second mandrel layer 140, or may be etched with the underlying portions of second mandrel layer 140 in a single etch step. Sacrificial fill material 220 is subsequently removed, along with underlying portions of sacrificial etch-stop layer 170 if included, to expose second mandrel lines 141. As FIGS. 13 and 13A illustrate, second mandrel lines 141 have variable widths according to the variable widths of first mandrel lines 121 and first non-mandrel trenches 131, as described above. Second mandrel layer 140 may be etched, for example, by a selective RIE process or other anisotropic etch process.

Figure 14:
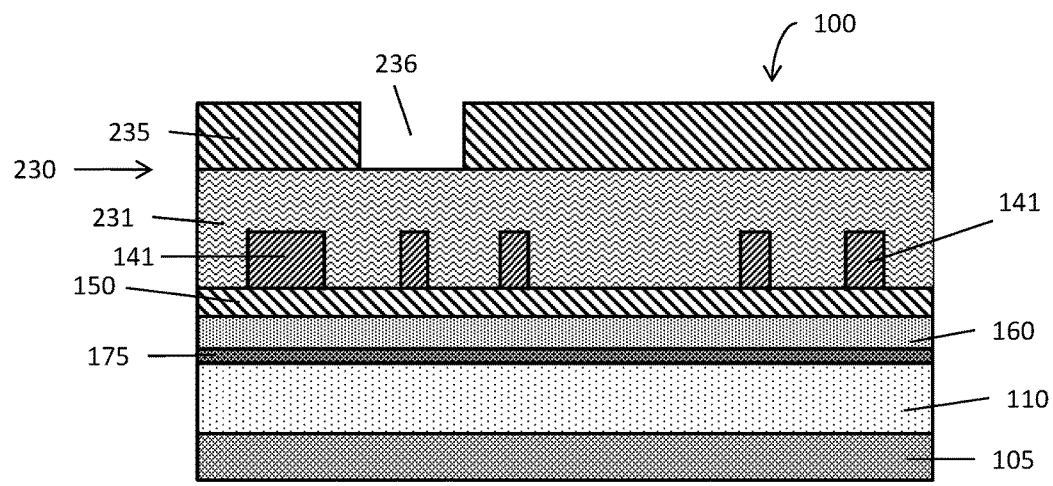
Figure 14A:
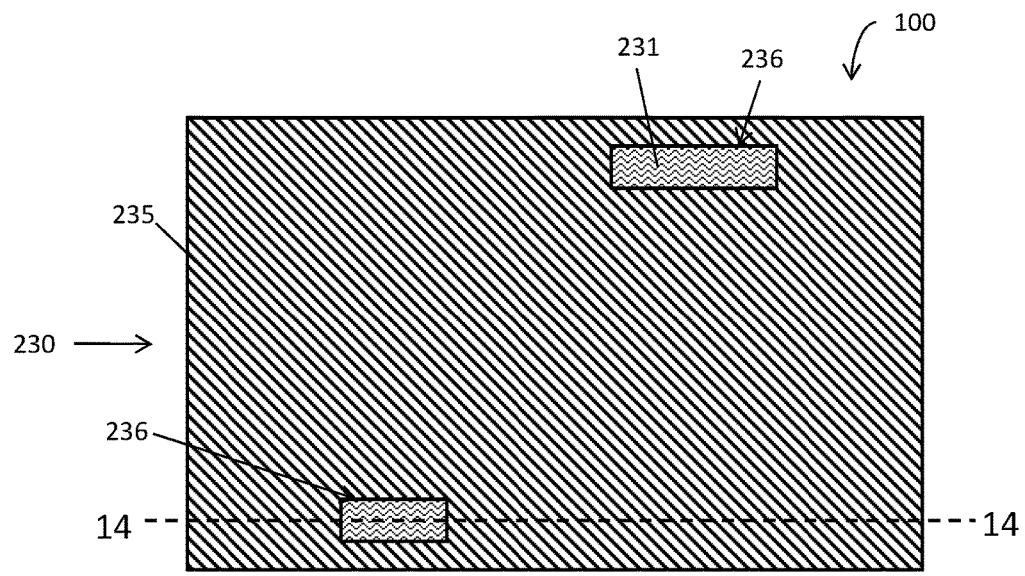

With reference to FIGS. 14 and 14A in which like reference numerals refer to like features in FIGS. 13 and 13A and at a subsequent fabrication stage of the processing method, the process may further include forming cuts in second mandrel lines 141. Second mandrel lines 141 may be cut if, according to the metallization layer to be formed, small tip-to-tip spacing is required between aligned metallization lines that cannot be achieved through the formation of first mandrel lines 121 or first non-mandrel trenches 131, as described above. For example, a metallization layer may include two aligned metallization lines that are separated by a space less than a critical dimension defined for the metallization layer, and it may not be possible to form such small spaces between aligned metallization lines in forming the first mandrel lines 121 as described above. If such small tip-to-tip spacings are not required, the steps illustrated in FIGS. 14 and 14A may be omitted and the process may further proceed as shown in FIG. 16.

As shown in FIGS. 14 and 14A, forming cuts in the second mandrel lines may, in exemplary embodiments, include forming a lithography stack 230 that includes a patterned resist layer 235 and underlying lithography stack layers 231. The patterned resist layer 235 has one or more cut openings 236 formed in it that expose underlying portions of lithography stack layers 231. The exposed portions of lithography stack layers 231 are removed, such as by a selective RIE process, to expose portions of second mandrel lines 141 to be removed to form the cuts in second mandrel lines 141.

Figure 15:
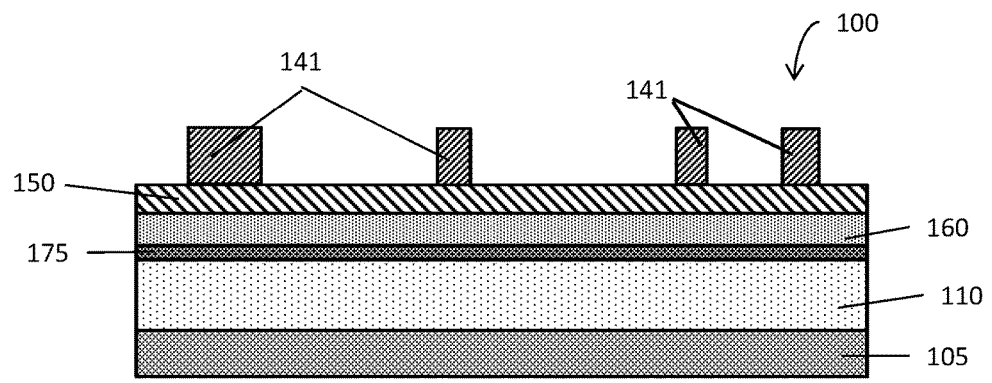
Figure 15A:
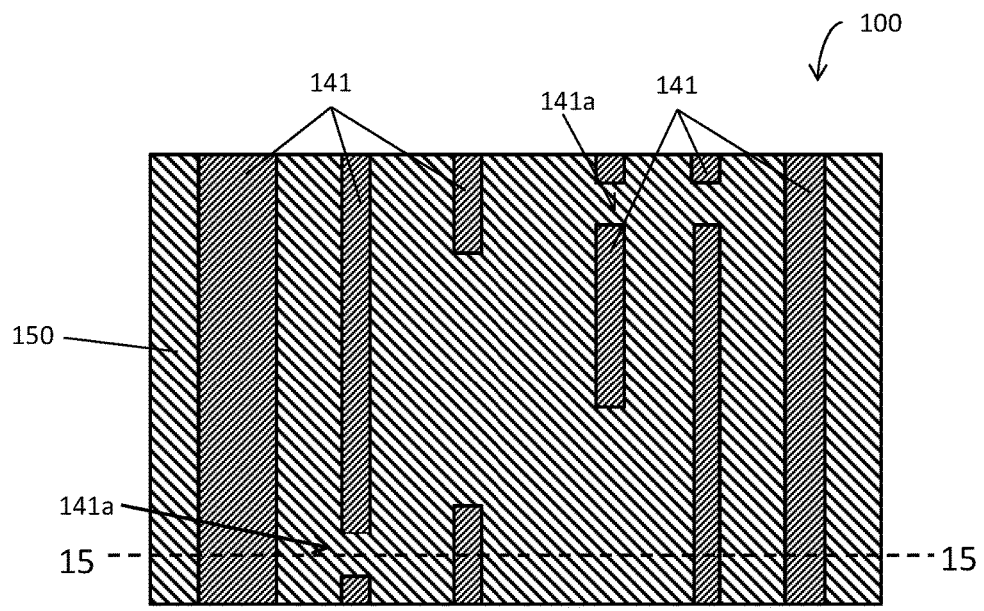

With reference to FIGS. 15 and 15A in which like reference numerals refer to like features in FIGS. 14 and 14A and at a subsequent fabrication stage of the processing method, the exposed portions of second mandrel lines 141 are etched according to the cut openings 236 of the lithography stack 230. Lithography stack 230 is removed, leaving second mandrel lines 141 with small tip-to-tip cuts 141a, having a size less than a critical dimension defined for the metallization layer to be formed as described below, formed over intermediary mask layer 150.

Figure 16:
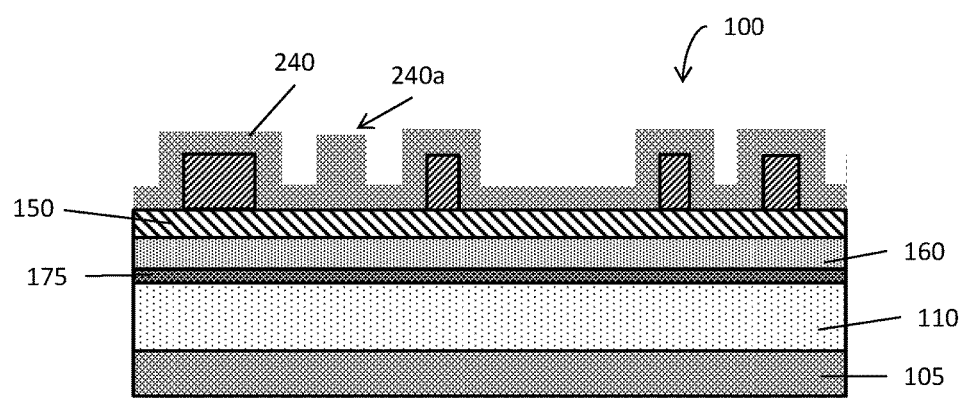

With reference to FIG. 16 in which like reference numerals refer to like features in FIGS. 15 and 15A and at a subsequent fabrication stage of the processing method, a spacer material 240 is deposited over second mandrel lines 141 and exposed portions of intermediary mask layer 150. Spacer material 240 may be deposited as a conformal layer by any deposition technique, such as chemical vapor deposition (CVD) or atomic layer deposition (ALD), and may be composed of an oxide of silicon, an oxide of titanium, or other dielectric material. Portions 240a of the spacer material 240 may form in the small tip-to-tip cuts 141a in the second mandrel lines 141.

Figure 17:
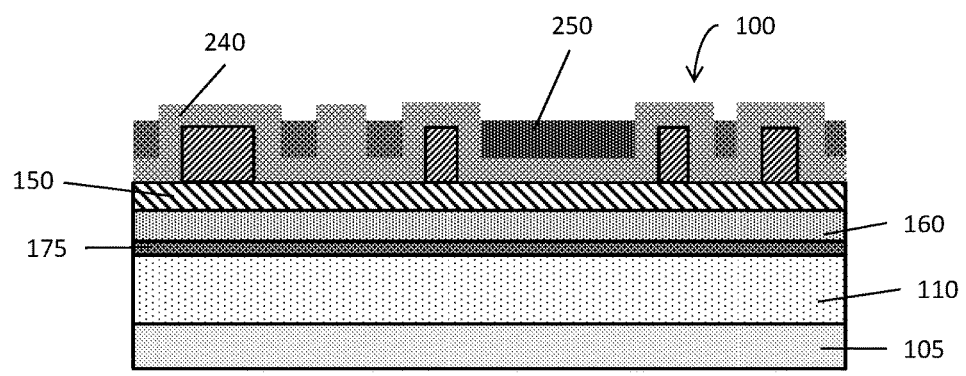

With reference to FIG. 17 in which like reference numerals refer to like features in FIG. 16 and at a subsequent fabrication stage of the processing method, a gapfill material 250 is deposited over spacer material 240 and recessed to expose upper portions of spacer material 240 that are disposed over second mandrel lines 141. Gapfill material 250 may be any material that may be selectively etched relative to spacer material 240 and second mandrel lines 141, such as a spin-on hardmask, a spin-on glass material, an oxide of titanium, or other material. Similar to forming small tip-to-tip cuts in second mandrel lines 141, small tip-to-tip spacing between aligned metallization lines may be required, according a design for a metallization level, for metallization lines that correspond to second non-mandrel trenches to be cut in the lower mask layer 160, as further described below. One process for forming small tip-to-tip cuts lines of a second non-mandrel pattern is illustrated in FIGS. 17 through 20, as described below, in which the "cuts" are defined as portions of spacer material 240 that are blocked and protected from etching of the spacer material 240 to partially define a second non-mandrel pattern, as further described in FIG. 21 and subsequent figures. For example, a metallization layer may include two aligned metallization lines that are separated by a space less than a critical dimension defined for the metallization layer, and it may not be possible to form such small spaces between aligned metallization lines in forming the first mandrel trenches 132 as described above. If such small tip-to-tip cuts are not required for the second non-mandrel trenches to be cut in the lower mask layer 160, the process may omit the steps described below for FIGS. 17-20, and may proceed with FIG. 21 instead.

Figure 18:
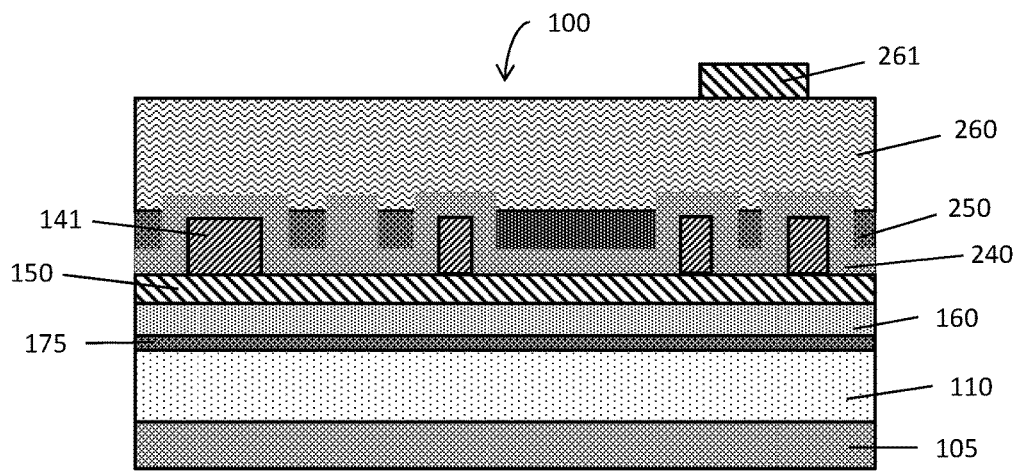
Figure 18A:
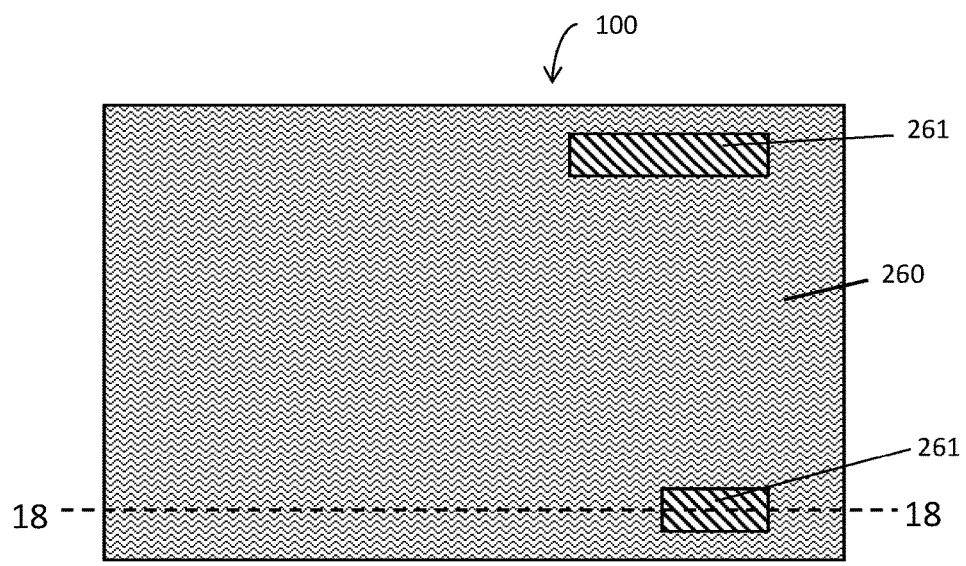

With reference to FIGS. 18 and 18A in which like reference numerals refer to like features in FIG. 17 and at a subsequent fabrication stage of the processing method, a lithography stack 260 is formed over spacer material 240 and gapfill material 250, and one or more resist blocks 261 are formed over the lithography stack 260. Resist blocks 261 correspond to the one or more "cuts" to be made in one or more lines of the second non-mandrel pattern, and cover portions of lithography stack 260 to be left unetched. The resist blocks 261 leave exposed a remaining portions of lithography stack 260 to be etched.

Figure 19:
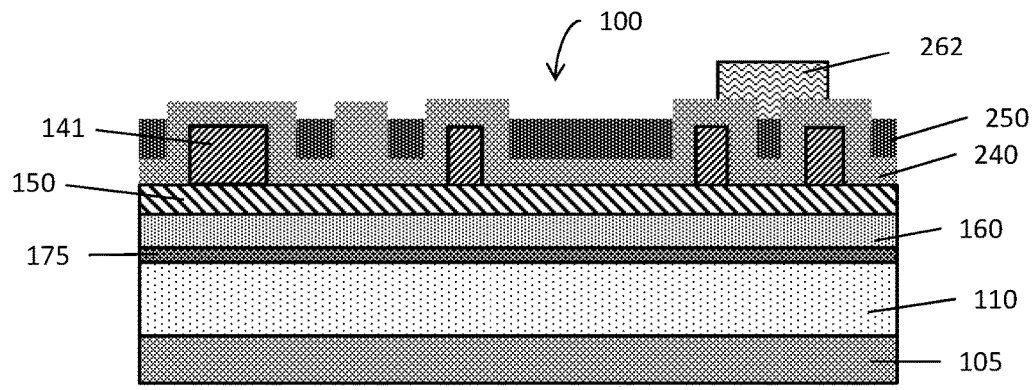

With reference to FIG. 19 in which like reference numerals refer to like features in FIGS. 18 and 18A and at a subsequent fabrication stage of the processing method, lithography stack 260 is etched and removed, leaving behind a portion 262 over a portion of gapfill material 250. The resist blocks 261 are also removed. The portion 262 of lithography stack that remains protects a portion of gapfill material 250, leaving the remaining portions of gapfill material 250 exposed.

Figure 20:
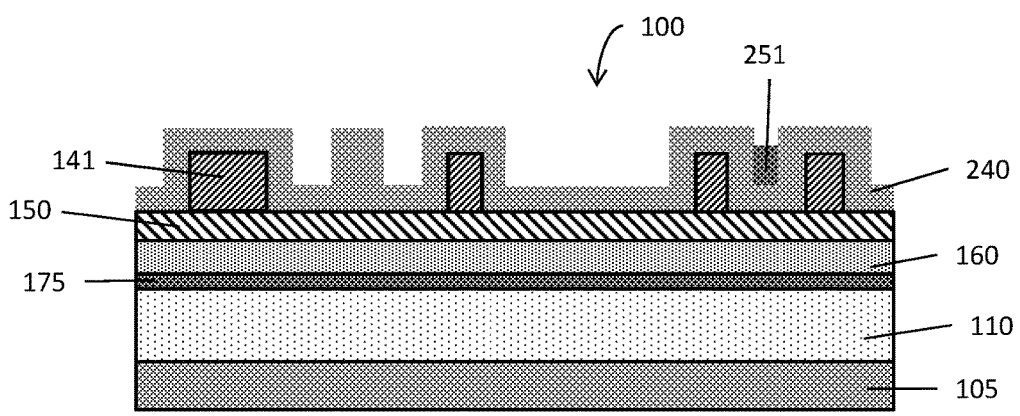

With reference to FIG. 20 in which like reference numerals refer to like features in FIG. 19 and at a subsequent fabrication stage of the processing method, the exposed portions of gapfill material 250 are etched and removed, leaving only portions of gapfill material 251 protected by lithography stack portions 262. The remaining portions 262 of lithography stack 260 are also removed. The remaining portions of gapfill material 251 remain to protect underlying portions of spacer material 240 as spacer material is recessed in subsequent stages, as described below, and thus define the "cuts" having a size less than a critical dimension, as defined for the metallization layer to be formed as described below, in lines of the second non-mandrel pattern.

In alternative embodiments, cuts in lines of the second non-mandrel pattern may be formed in a cut or etch process similar to the etch process illustrated in FIGS. 14-15A, in which a lithography stack 260 is formed over spacer material 240 and gapfill material 250, where instead of resist blocks defining the "cuts" to be made in second non-mandrel lines of the second mandrel pattern, openings are patterned in the lithography stack 260 that correspond to cuts in the second non-mandrel lines. The portions of the lithography stack 260 exposed by the openings are etched to expose portions of gapfill material 250, and the exposed portions of the gapfill material are removed, such as by a selective RIE process, to form cuts in the gapfill material 250. The cuts in gapfill material 250 may then be filled with additional spacer material composed of the same material as spacer material 240. The additional spacer material merges with the existing spacer material 240, defining the "cuts" in second non-mandrel lines of the second non-mandrel pattern.

Figure 21:
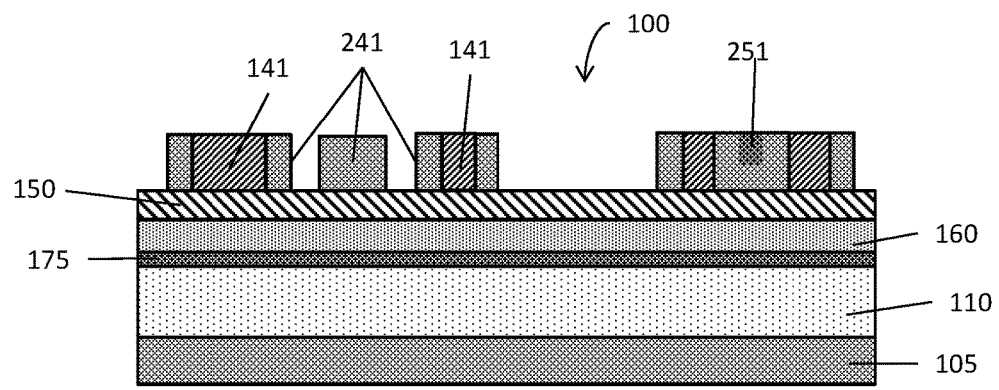
Figure 21A:
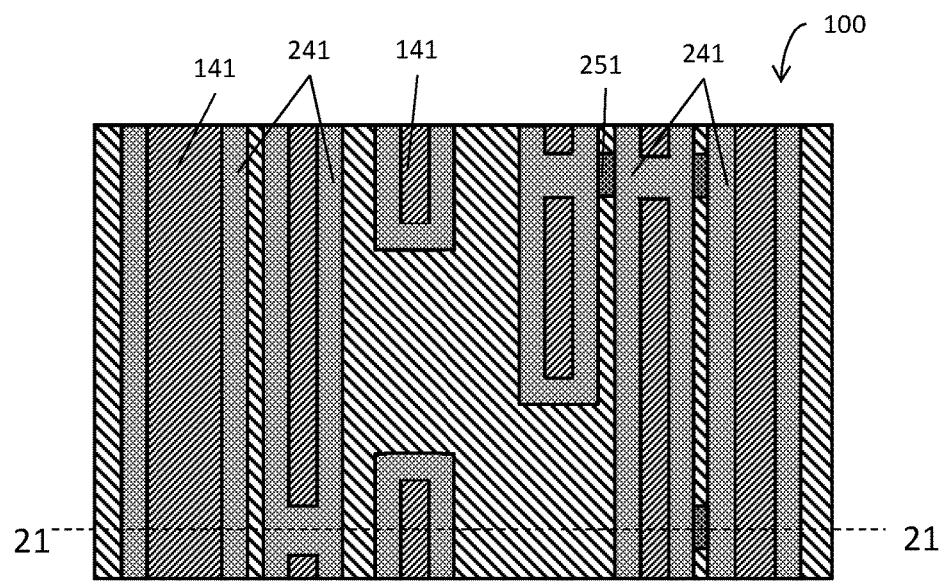

With reference to FIGS. 21 and 21A in which like reference numerals refer to like features in FIG. 20 and at a subsequent fabrication stage of the processing method, spacer material 240 is etched to form second mandrel spacers 241 on sidewalls of second mandrel lines 141 and to remove spacer material from over intermediary mask layer 150. Second mandrel spacers 241 define spaces 242 between the second mandrel spacers 241, with the spaces exposing portions of intermediary mask layer 150 that correspond to a first portion of a second non-mandrel pattern, which second non-mandrel pattern is formed as second non-mandrel trenches in lower mask layer 160 as described below. Portions of gapfill material 251 also remain, if formed as described above in FIGS. 17-20, over portions of spacer material 240 to protect those portions of spacer material 240 from the recessing process. In embodiments, the first portion of the second non-mandrel pattern may be the entirety of the second non-mandrel pattern. In other embodiments, as further described below, the second portion of the second non-mandrel pattern may be formed in multiple lithography steps to define and etch second non-mandrel trenches 162 in lower mask layer 160.

Figure 22:
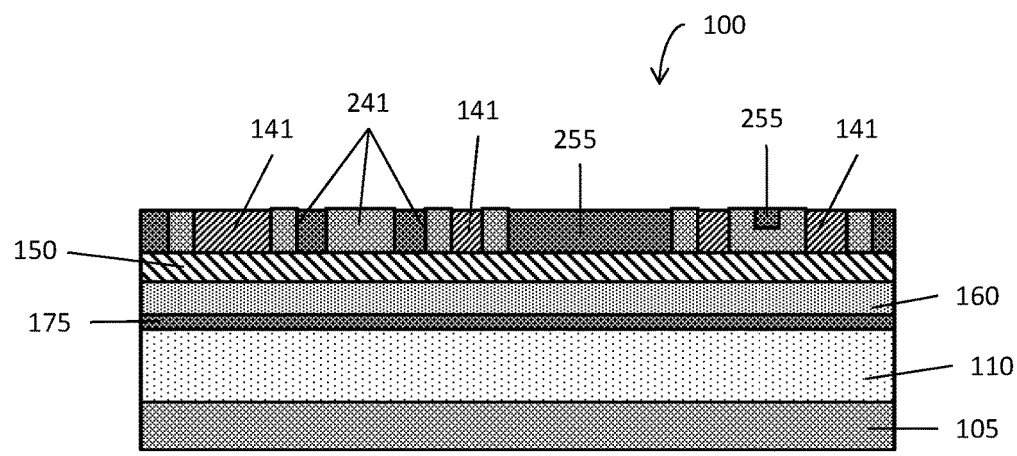

With reference to FIG. 22 in which like reference numerals refer to like features in FIGS. 21 and 21A and at a subsequent fabrication stage of the processing method, a sacrificial gapfill material 255 is deposited in the spaces 242 between second mandrel spacers 241. The sacrificial gapfill material 255 may be deposited by any deposition process, such as by CVD or ALD processes, and subsequently planarized by, for example, a chemical-mechanical polishing (CMP) process. In embodiments, the gapfill material 251 may be removed from over underlying portions of spacer material 240, and sacrificial gapfill material 255 may re-fill spaces left by removal of gapfill material 251. In other embodiments, gapfill material 251 may remain and may be planarized with sacrificial gapfill material 255. Sacrificial gapfill material 255 may be composed of the same material as gapfill material 250, 251 or may be composed of a different material.

Figure 23:
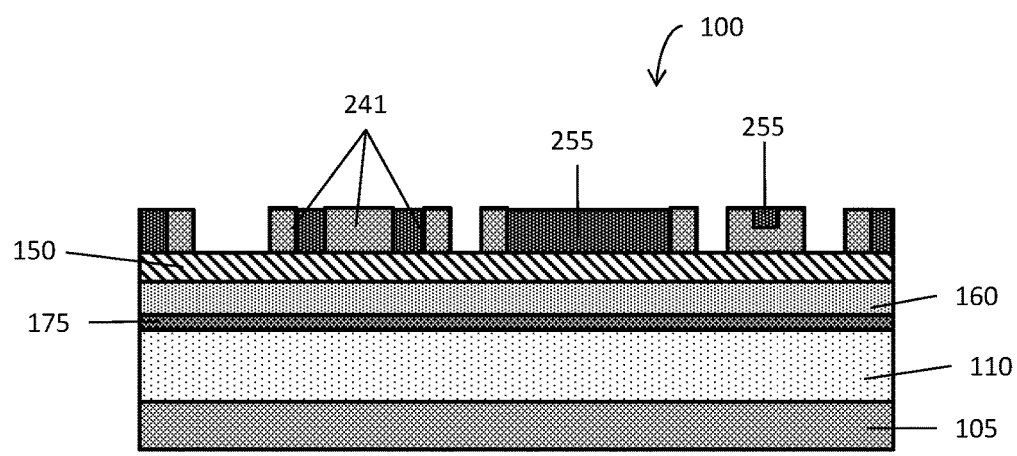

With reference to FIG. 23 in which like reference numerals refer to like features in FIG. 22 and at a subsequent fabrication stage of the processing method, second mandrel lines 141 are removed to expose underlying portions of intermediary mask layer 150 corresponding to second mandrel trenches to be etched through intermediary mask layer 150 and into lower mask layer 160.

Figure 24:
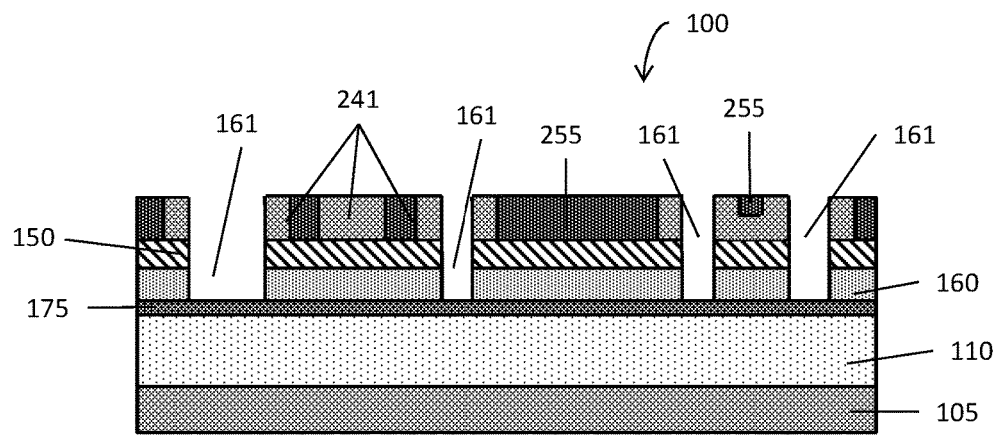

With reference to FIG. 24 in which like reference numerals refer to like features in FIG. 23 and at a subsequent fabrication stage of the processing method, second mandrel trenches 161, corresponding to the removed second mandrel lines 141, are etched through intermediary mask layer 150 and into lower mask layer 160. As intermediary mask layer 150 and lower mask layer 160 are composed of different mask materials, the exposed portions of intermediary mask layer 150 may be etched first, with lower mask layer 160 acting as an etch stop for the etch process, to expose underlying portions of lower mask layer 160. Lower mask layer 160 may be subsequently etched, with sacrificial etch-stop layer 175 acting as an etch stop for the etch process if included, to define second mandrel trenches in the lower mask layer 160. The etching of either lower mask layer 160 or intermediary mask layer 150 may include, for instance, a selective RIE process that is selective to the material of the mask layer being etched.

Figure 25:
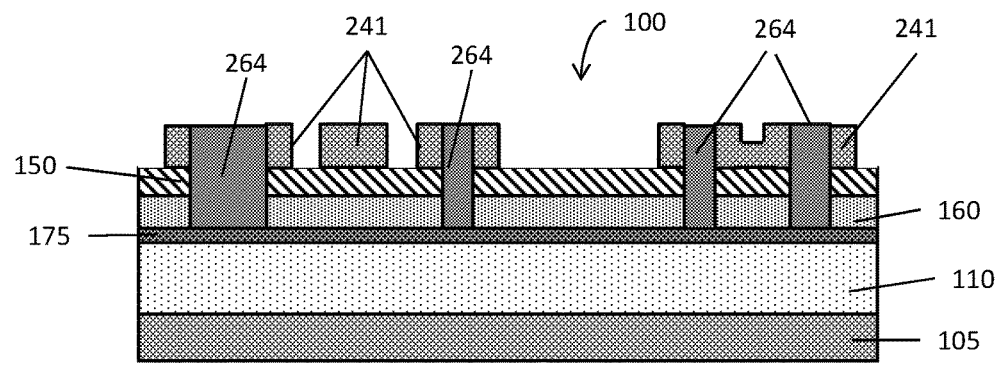

With reference to FIG. 25 in which like reference numerals refer to like features in FIG. 24 and at a subsequent fabrication stage of the processing method, the second mandrel trenches 161 are filled with a sacrificial fill material 264, such as a spin-on glass material or other sacrificial fill material and subsequently planarized by, for example, a chemical-mechanical polishing (CMP) process. Sacrificial gapfill material 255 is subsequently etched and removed to expose a portion of intermediary mask layer 150.

Figure 26:
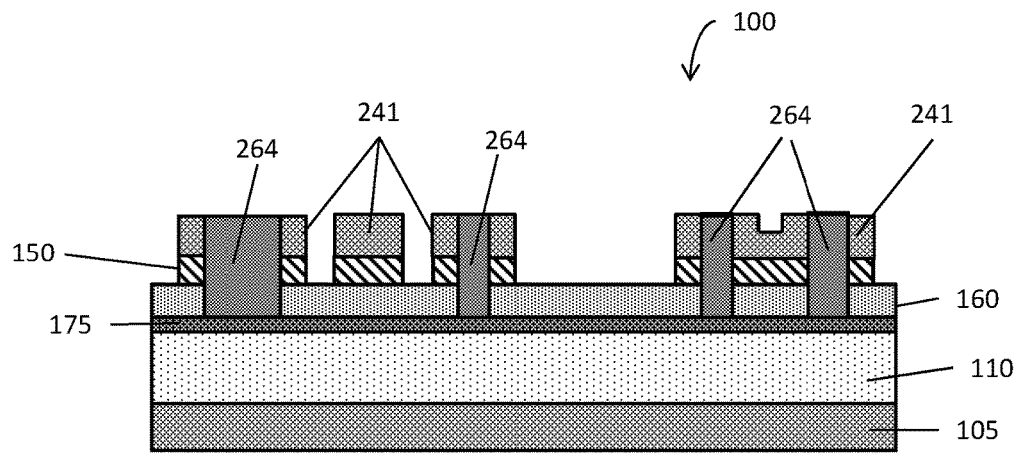

With reference to FIG. 26 in which like reference numerals refer to like features in FIG. 25 and at a subsequent fabrication stage of the processing method, the exposed portions of intermediary mask layer 150 are etched. The etched portion of intermediary mask layer 150 may be a first portion of intermediary mask layer 150 corresponding to the first portion of the second non-mandrel pattern to be etched in lower mask layer 160. Second mandrel spacers 241 protect an underlying second portion of intermediary mask layer 150. As described below, the second portion of the intermediary mask layer 150 that remains unetched protects underlying portions of lower mask layer 160 that should remain unetched in later processing stages.

Figure 27:
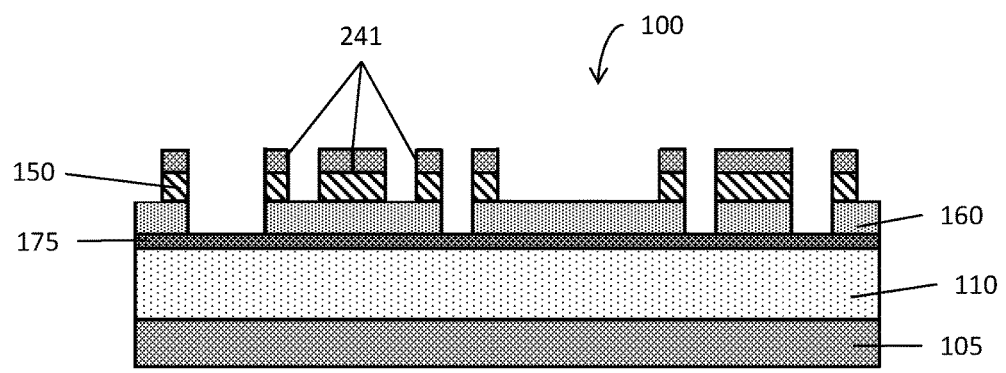

With reference to FIG. 27 in which like reference numerals refer to like features in FIG. 26 and at a subsequent fabrication stage of the processing method, the sacrificial fill material 264 is removed, exposing portions of etch-stop layer 175 over dielectric layer 110. Second mandrel spacers 241 may be recessed down or planarized, as illustrated, if required.

Figure 28:
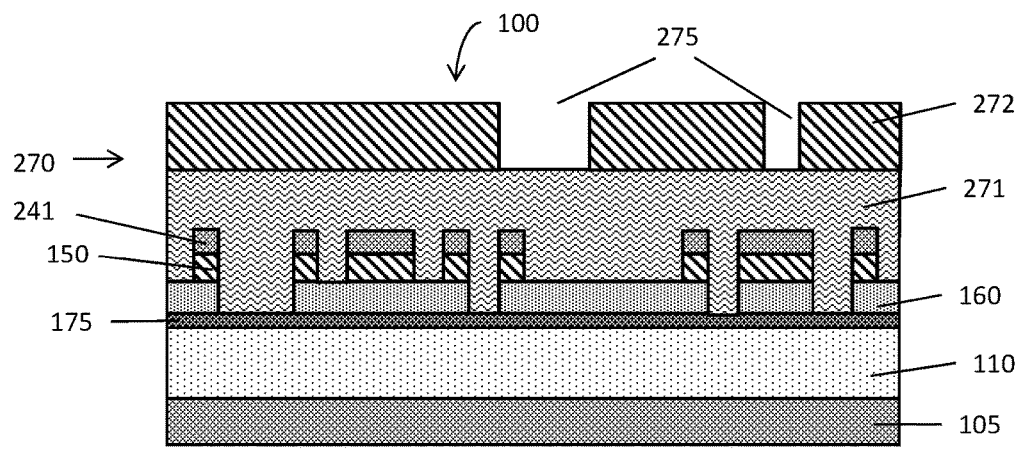
Figure 28A:
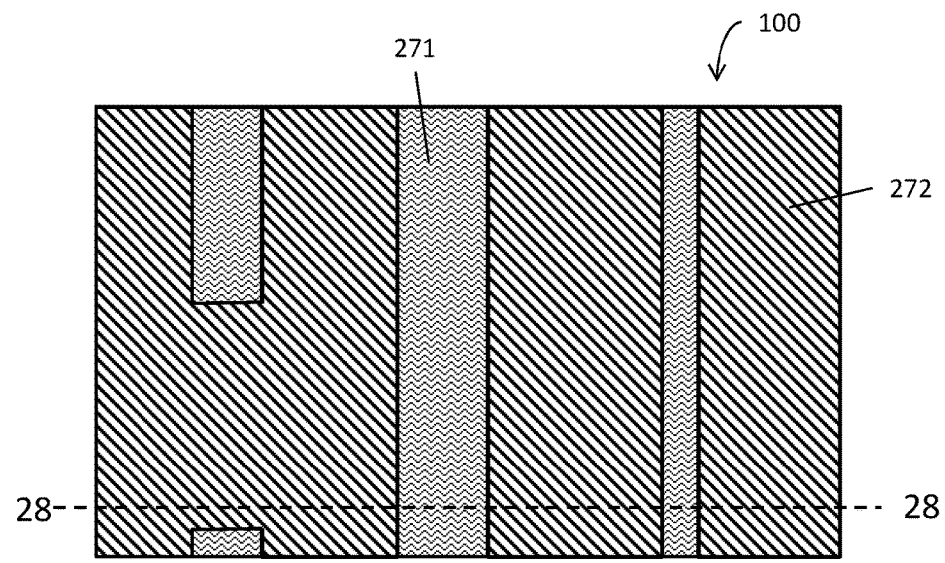

With reference to FIGS. 28 and 28A in which like reference numerals refer to like features in FIG. 27 and at a subsequent fabrication stage of the processing method, a patterned lithography stack 270 is formed over the intermediary mask layer 150 and lower mask layer 160, with the patterned lithography stack 270 having openings 275 corresponding to portions of the lower mask layer 160 to be etched. Patterned lithography stack may include lithography stack layers 271 and a patterned resist layer 272.

Figure 29:
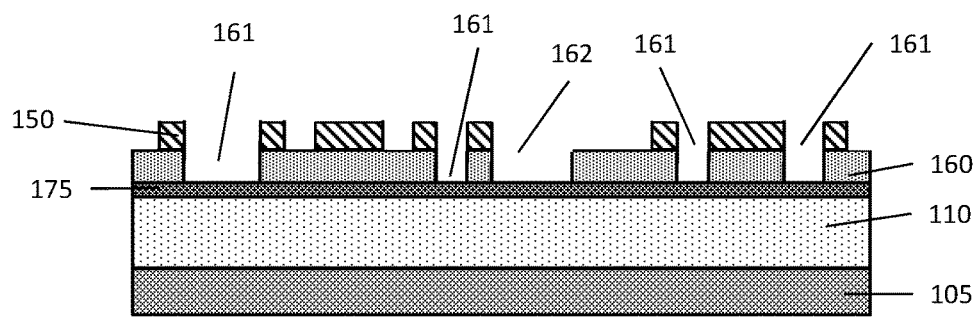
Figure 29A:
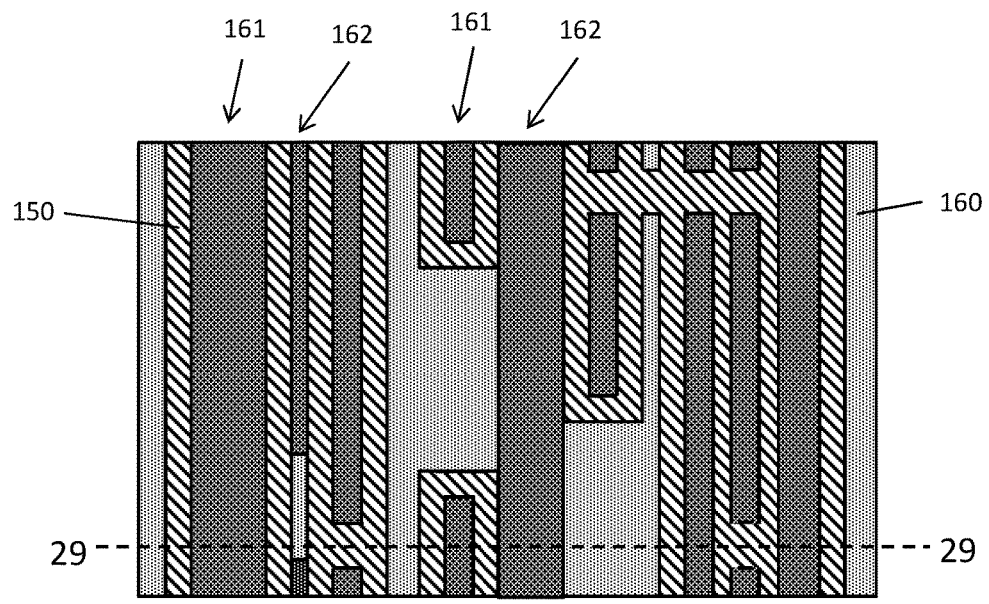

With reference to FIGS. 29 and 29A in which like reference numerals refer to like features in FIGS. 28 and 28A, the patterned lithography stack 270 is etched to expose portions of the lower mask layer 160 to be etched, and the exposed portions of lower mask layer 160 are selectively etched. The selective etching process is controlled to etch only the material of lower mask layer 160 without etching exposed portions of intermediary mask layer 150. The etching defines and etches a part of the second portion of the second non-mandrel pattern as second non-mandrel trenches 162 in lower mask layer 160.

Figure 30:
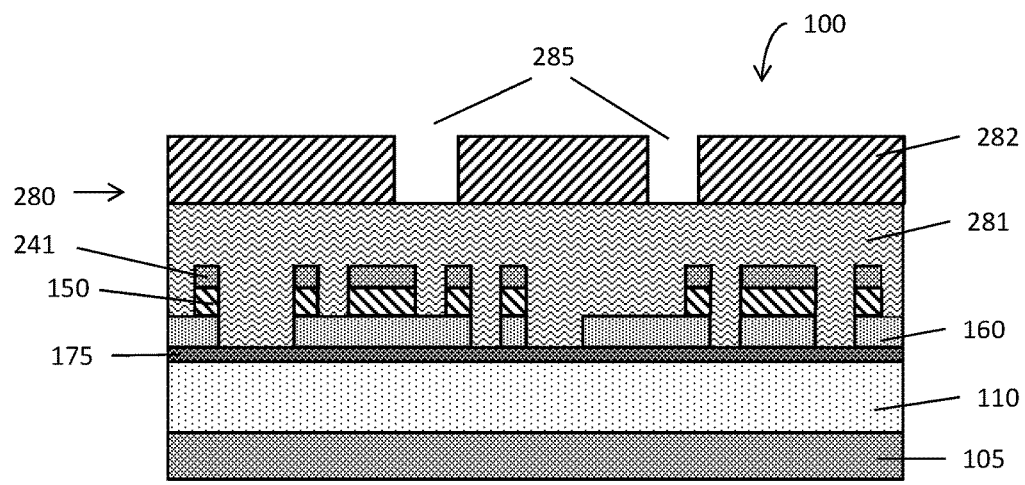
Figure 30A:
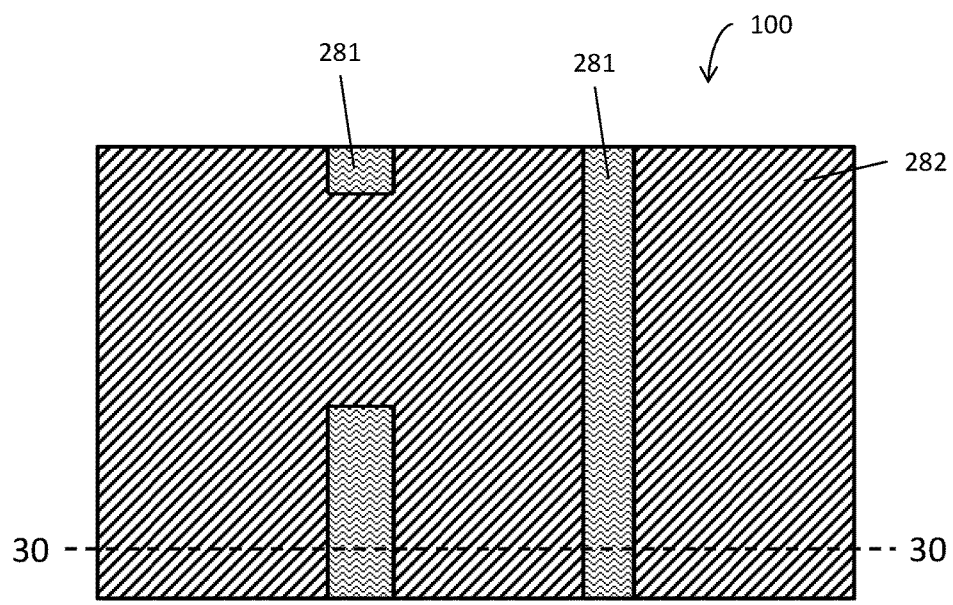

With reference to FIGS. 30 and 30A in which like reference numerals refer to like features in FIGS. 29 and 29A and at a subsequent fabrication stage of the processing method, another patterned lithography stack 280 is formed over the intermediary mask layer 150 and lower mask layer 160, with the other patterned lithography stack 280 having openings 285 corresponding to portions of the lower mask layer 160 to be etched in an additional etching process, as described below. Patterned lithography stack 280 may include lithography stack layers 281 and a patterned resist layer 282.

Figure 31:
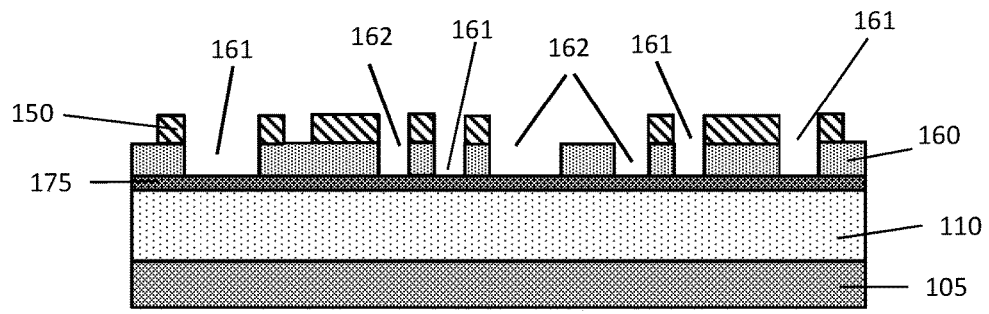
Figure 31A:
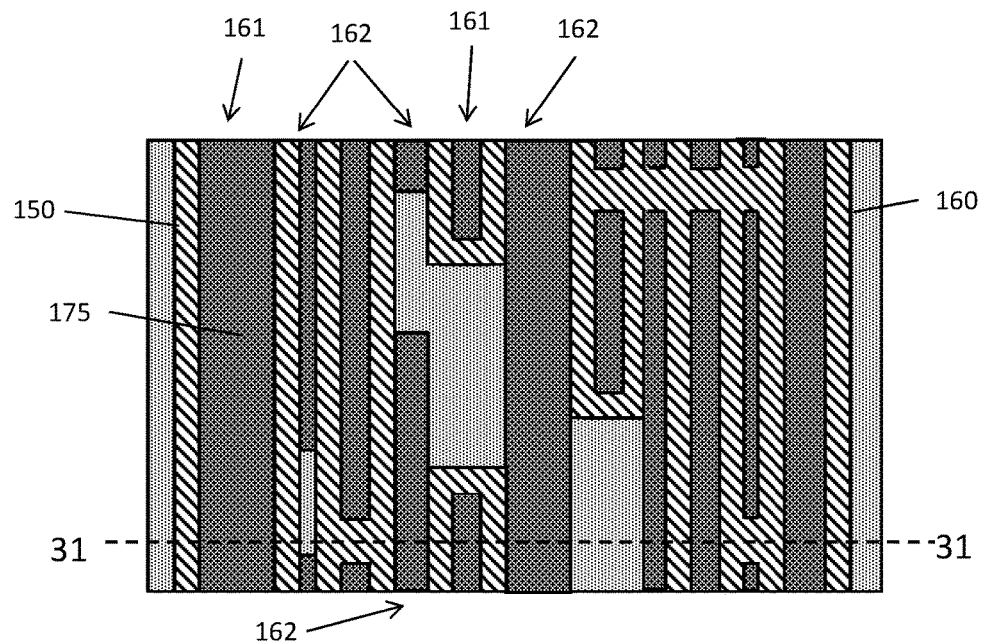

With reference to FIGS. 31 and 31A in which like reference numerals refer to like features in FIGS. 30 and 30A and at a subsequent fabrication stage of the processing method, the patterned lithography stack 280 is etched to expose portions of the lower mask layer 160 to be etched, and the exposed portions of lower mask layer 160 are selectively etched in an additional selective etching process. The additional selective etching process is controlled to etch only the material of lower mask layer 160 without etching exposed portions of intermediary mask layer 150. The additional selective etching defines and etches another part of the second portion of the second non-mandrel pattern as second non-mandrel trenches 162 in lower mask layer 160. The first etching of lower mask layer 160 and additional etching of lower mask layer 160 together define the second portion of the second non-mandrel pattern in lower mask layer 160 and form the second non-mandrel trenches 162 in lower mask layer 160. The first portion of the second non-mandrel pattern, as define in previous processing stages, and second portion of the second non-mandrel pattern together define the second non-mandrel trenches 162. The second non-mandrel trenches 162 and second mandrel trenches 161 define the metallization line pattern to be etched into dielectric layer 110.

Figure 32:
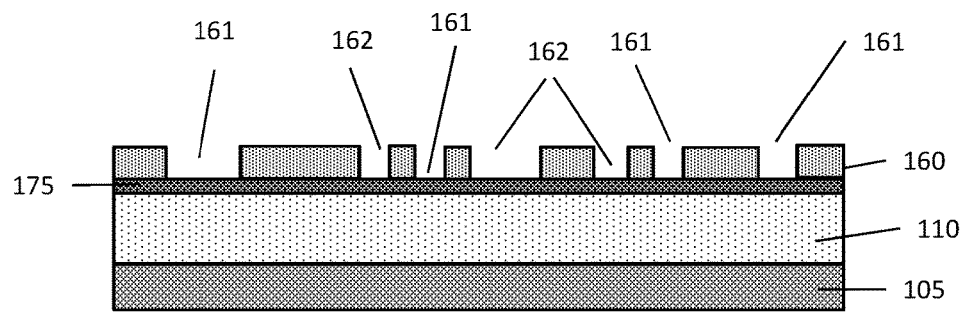
Figure 32A:
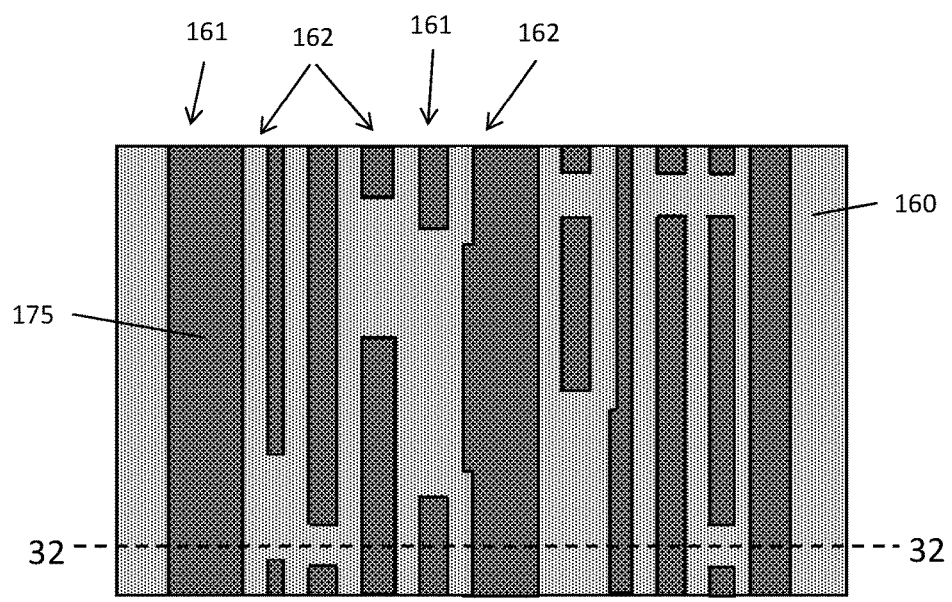

With reference to FIGS. 32 and 32A in which like reference numerals refer to like features in FIGS. 31 and 31A and at a subsequent fabrication stage of the processing method, remaining portions of intermediary mask layer 150 are removed, exposing underlying portions of lower mask layer 160. Second mandrel trenches 161 and second non-mandrel trenches 162 together define the metallization pattern to be etched into dielectric layer 110 and subsequently filled with metal material.

Figure 33:
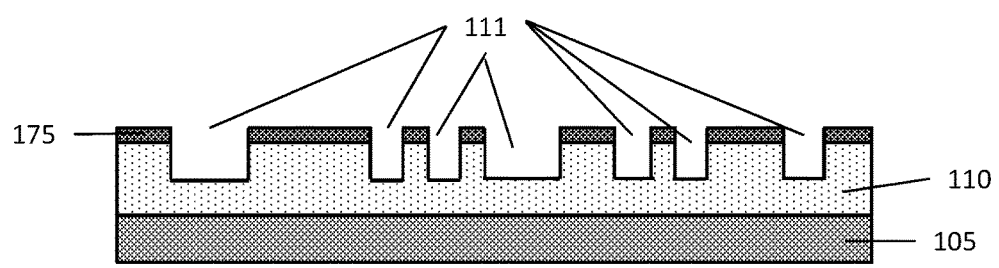

With reference to FIG. 33 in which like reference numerals refer to like features in FIGS. 32 and 32A and at a subsequent fabrication stage of the processing method, metallization trenches 111 are etched in dielectric layer 110, and lower mask layer 160 is subsequently removed from over sacrificial etch-stop layer 175, if included, and dielectric layer 110. Metallization trenches 111 correspond to second mandrel trenches 161 and second non-mandrel trenches 162 together.

Figure 34:
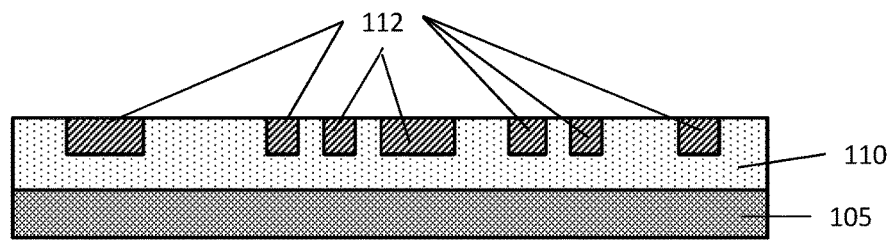

With reference to FIG. 34 in which like reference numerals refer to like features in FIGS. 32 and 32A and at a subsequent fabrication stage of the processing method, a metal is deposited in metallization trenches 111 to form metallization lines 112. Sacrificial etch-stop layer 175, if included, may be removed prior to depositing the metal. The metal may be composed of any conductive material, such as copper or cobalt or other metal, and deposition of the metal may be followed by planarization of the metal, such as by a CMP process, to planarize the metallization lines 112 with an upper surface of dielectric layer 110.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first mandrel layer over a first mask layer and a second mandrel layer underlying the first mask layer;
   etching the first mandrel layer to form a plurality of first mandrel lines, the plurality of first mandrel lines having variable widths;
   etching a plurality of first non-mandrel trenches in the first mask layer, the plurality of first non-mandrel trenches having variable widths;
   etching a plurality of first mandrel trenches, using the plurality of first mandrel lines as an etch mask, in the first mask layer, wherein the plurality of first mandrel trenches and the plurality of first non-mandrel trenches define a mandrel pattern; and
   forming a plurality of second mandrel lines in the second mandrel layer according to the mandrel pattern, the plurality of second mandrel lines having the variable widths of the plurality of first mandrel lines and the variable widths of the plurality of first non-mandrel trenches.

2. The method of claim 1 wherein etching the plurality of first non-mandrel trenches comprises:
   depositing a spacer material over the plurality of first mandrel lines and the first mask layer;
   etching the spacer material to form a plurality of first mandrel spacers having a uniform width on sidewalls of the plurality of first mandrel lines and defining spaces having variable widths between the plurality of first mandrel spacers, wherein the spaces expose portions of the first mask layer; and
   etching the exposed portions of the first mask layer to form the plurality of first non-mandrel trenches, wherein the variable widths of the spaces define the variable widths of the plurality of first non-mandrel trenches.

3. The method of claim 2, further comprising:
   prior to etching the first mask layer, forming a lithography stack over the plurality of first mandrel lines and the plurality of first mandrel spacers, the lithography stack filling the spaces between the plurality of first mandrel spacers;

forming a patterned resist layer over the lithography stack, the patterned resist layer having a plurality of openings exposing respective portions of the lithography stack to be etched; and etching the exposed portions of the lithography stack to expose respective portions of the first mask layer, the remaining lithography stack and the first mandrel spacers protecting other portions of the first mask layer from the etching, and the etching defining a first non-mandrel pattern of non-mandrel lines having the variable widths; and etching the exposed portions of the first mask layer.

4. The method of claim 1 wherein etching the plurality of first mandrel trenches comprises:

depositing a first sacrificial hardmask over the first mask layer and between the plurality of first mandrel lines;

removing the plurality of first mandrel lines to expose portions of the first mask layer;

etching the exposed portions of the first mask layer to form the plurality of first mandrel trenches; and removing the first sacrificial hardmask.

5. The method of claim 1 wherein forming the plurality of second mandrel lines comprises:

depositing a first sacrificial fill material in the plurality of first mandrel trenches and the plurality of first non-mandrel trenches;

removing the first mask layer to expose portions of the second mandrel layer;

etching the exposed portions of the second mandrel layer, the sacrificial fill material protecting remaining portions of the second mandrel layer; and removing the first sacrificial fill material to expose the plurality of second mandrel lines.

6. The method of claim 1 further comprising:

forming at least one cut in one second mandrel line of the plurality of second mandrel lines.

7. The method of claim 6 wherein forming the at least one cut in the one second mandrel line comprises:

forming a lithography stack over the plurality of second mandrel lines;

patterning at least one cut opening in the lithography stack, the at least one cut opening exposing a portion of the one second mandrel line to be removed; and etching the exposed portion of the one second mandrel line.

8. The method of claim 6 wherein the at least one cut in the one second mandrel line is less than a critical dimension defined for a metallization layer.

9. The method of claim 1 wherein the second mandrel layer overlies a second mask layer and an intermediary mask layer disposed between the second mandrel layer and the second mask layer, and further comprising:

patterning a first portion of a second non-mandrel pattern in the intermediary mask layer using the plurality of second mandrel lines;

etching a plurality of second mandrel trenches, using the plurality of second mandrel lines, through the second mask layer and the patterned intermediary mask layer; and patterning the first portion and a second portion of the second non-mandrel pattern in the second mask layer using a second portion of the intermediary mask layer, the patterning forming a plurality of second non-mandrel trenches in the second mask layer.

10. The method of claim 9 wherein the second mask layer is disposed over a dielectric layer, the plurality of second mandrel trenches and the plurality of second non-mandrel trenches exposing portions of the dielectric layer, and further comprising:

etching the exposed portions of the dielectric layer to form a plurality of metallization trenches;

removing the second mask layer and the intermediary mask layer; and depositing a metal in the plurality of metallization trenches to form a plurality of metal lines.

11. The method of claim 9 wherein patterning the first portion of the second non-mandrel pattern comprises:

depositing a spacer material over the plurality of second mandrel lines and the second mask layer; and etching the spacer material to form a plurality of second mandrel spacers having a uniform width on sidewalls of the plurality of second mandrel lines and define spaces having variable widths between the plurality of second mandrel spacers, the spaces exposing a first portion of the intermediary mask layer corresponding to the first portion of the second non-mandrel pattern.

12. The method of claim 11, further comprising:

prior to etching the spacer material, forming at least one cut in one line of the second non-mandrel pattern.

13. The method of claim 12 wherein forming at least one cut in the one line of the second non-mandrel pattern comprises:

depositing a gapfill material over the spacer material;

recessing the gapfill material to expose upper portions of the spacer material disposed over the second mandrel lines;

forming a lithography stack over the gapfill material and the spacer material;

forming at least one resist block over a portion of the lithography stack, the at least one resist block corresponding to the at least one cut in the one line of the second non-mandrel pattern and leaving an exposed portion of the lithography stack;

removing the exposed portion of the lithography stack to expose a portion of the gapfill material; and removing the exposed portion of the gapfill material, wherein the remaining portion of the gapfill material defines the at least one cut in the one line of the second non-mandrel pattern.

14. The method of claim 12 wherein forming at least one cut in the one line of the second non-mandrel pattern comprises:

depositing a gapfill material over the spacer material;

recessing the gapfill material to expose portions of the spacer material disposed over the second mandrel lines;

forming a patterned lithography stack over the gapfill material and the spacer material, the patterned lithography stack having at least one opening that exposes a portion of the gapfill material corresponding to the at least one cut in the one line of the second non-mandrel pattern;

removing the exposed portion of the gapfill material to form a cut in the gapfill material; and depositing the spacer material in the cut in the gapfill material, the spacer material merging with the second mandrel spacers and defining the at least one cut in the one line of the second non-mandrel pattern.

15. The method of claim 12 wherein the at least one cut in the one line of the second non-mandrel pattern is less than a critical dimension defined for a metallization layer.

16. The method of claim 11 wherein etching the plurality of second mandrel trenches comprises:
- depositing a sacrificial gapfill material in the spaces between the plurality of second mandrel spacers;
- removing the plurality of second mandrel lines to expose underlying portions of the intermediary mask layer; and
- etching the exposed underlying portions of the intermediary mask layer and the underlying portions of the second mask layer.

17. The method of claim 16 wherein patterning the first portion and the second portion of the second non-mandrel pattern in the second mask layer comprises:
- selectively removing the sacrificial gapfill material to expose the first portion of the intermediary mask layer;
- removing the exposed first portion of the intermediary mask layer to expose a first portion of the second mask layer corresponding to the first portion of the second non-mandrel pattern;
- removing the second mandrel spacers to expose the second portion of the intermediary mask layer, the second portion of the intermediary mask layer overlying a second portion of the second mask layer;
- performing a first selective etch of a first part of the first portion of the intermediary mask layer; and
- performing a second selective etch of a second part of the first portion of the intermediary mask layer,
- wherein the second portion of the intermediary mask layer protects the second portion of the second mask layer from the first selective etch and the second selective etch, and the first selective etch and the second selective etch together correspond to the second portion of the second non-mandrel pattern.

18. The method of claim 17 wherein performing the first selective etch comprises:
- forming a patterned lithography stack over the intermediary mask layer and the second mask layer, the patterned lithography stack having openings corresponding to portions of the second mask layer to be etched;
- etching the patterned lithography stack to expose the portions of the second mask layer to be etched; and
- selectively etching the second mask layer.

19. The method of claim 17 wherein performing the second selective etch comprises:
- forming a patterned lithography stack over the intermediary mask layer and the second mask layer, the patterned lithography stack having openings corresponding to portions of the second mask layer to be etched;
- etching the patterned lithography stack to expose the portions of the second mask layer to be etched; and
- selectively etching the second mask layer.

20. The method of claim 17 wherein removing the plurality of second mandrel spacers comprises:
- depositing a second sacrificial fill material in the plurality of second mandrel trenches; and
- selectively etching the plurality of second mandrel spacers from over the second portion of the intermediary mask layer.

* * * * *